United States Patent
Kwon et al.

(10) Patent No.: US 9,429,842 B2
(45) Date of Patent: Aug. 30, 2016

(54) POSITIVE PHOTOSENSITIVE RESIN COMPOSITION, PHOTOSENSITIVE RESIN FILM PREPARED BY USING THE SAME, AND DISPLAY DEVICE

(71) Applicant: SAMSUNG SDI CO., LTD., Yongin-si (KR)

(72) Inventors: Ji-Yun Kwon, Suwon-si (KR); Jin-Young Lee, Suwon-si (KR); Bum-Jin Lee, Suwon-si (KR); Jae-Hwan Song, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

(21) Appl. No.: 14/446,517

(22) Filed: Jul. 30, 2014

(65) Prior Publication Data

US 2015/0147694 A1 May 28, 2015

(30) Foreign Application Priority Data

Nov. 26, 2013 (KR) .................. 10-2013-0144717

(51) Int. Cl.
*G03F 7/023* (2006.01)
*C08G 73/10* (2006.01)
*C08G 73/22* (2006.01)
*G03F 7/022* (2006.01)

(52) U.S. Cl.
CPC ............ *G03F 7/0226* (2013.01); *C08G 73/10* (2013.01); *C08G 73/22* (2013.01); *G03F 7/0233* (2013.01)

(58) Field of Classification Search
CPC ... G03F 7/0233; G03F 7/0226; C08G 73/10; C08G 73/22
USPC ........... 430/18, 191, 192, 193; 528/335, 353
See application file for complete search history.

(56) References Cited

U.S. PATENT DOCUMENTS

| 2,797,213 A | 6/1957 | Moore |
| 3,669,658 A | 6/1972 | Yonezawa et al. |
| 7,803,510 B2 * | 9/2010 | Naiini et al. .................. 430/190 |
| 7,846,646 B2 | 12/2010 | Kamijima |
| 8,440,288 B2 | 5/2013 | Kanda |
| 8,921,019 B2 | 12/2014 | Kwon et al. |
| 2010/0159217 A1 * | 6/2010 | Minegishi ..................... 428/201 |

FOREIGN PATENT DOCUMENTS

| JP | 2007-294511 | 11/2007 |
| JP | 4046563 B2 | 2/2008 |
| JP | 2011-053458 A | 3/2011 |
| JP | 2013-015701 | 1/2013 |
| KR | 10-2000-0035172 | 6/2000 |
| KR | 10-1275474 A | 5/2010 |
| KR | 10-2010-0080343 A | 7/2010 |
| KR | 10-2011-0022730 A | 3/2011 |
| KR | 10-2013-0030221 A | 3/2013 |
| KR | 10-2013-0078436 | 7/2013 |

* cited by examiner

*Primary Examiner* — John S Chu
(74) *Attorney, Agent, or Firm* — Additon, Higgins & Pendleton, P.A.

(57) ABSTRACT

Disclosed are a positive photosensitive resin composition including (A) an alkali soluble resin, (B) a photosensitive diazoquinone compound, (C) a thermosetting cross-linking agent represented by the following Chemical Formula 1, wherein each substituent of Chemical Formula 1 is the same as defined in the detailed description, and (D) a solvent, a photosensitive resin film using the same, and a display device.

[Chemical Formula 1]

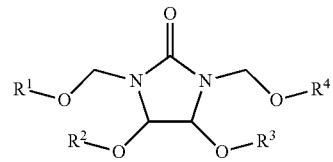

9 Claims, No Drawings

POSITIVE PHOTOSENSITIVE RESIN COMPOSITION, PHOTOSENSITIVE RESIN FILM PREPARED BY USING THE SAME, AND DISPLAY DEVICE

CROSS-REFERENCE TO RELATED APPLICATION

This application claims priority to and the benefit of Korean Patent Application No. 10-2013-0144717 filed in the Korean Intellectual Property Office on Nov. 26, 2013, the entire disclosure of which is incorporated herein by reference.

FIELD OF THE INVENTION

This disclosure relates to a positive photosensitive resin composition, a photosensitive resin film manufactured using the same, and a display device including the photosensitive resin film.

BACKGROUND

Aromatic polyimide (PI) and aromatic polybenzoxazole (PBO) are representative polymers having a rigid aromatic backbone, excellent mechanical strength, chemical resistance, weather resistance, heat resistance, and shape stability based on cyclic chemical stability and excellent electric characteristics such as insulation characteristic and the like due to a low dielectric constant. Thus, aromatic polyimides and aromatic polybenzoxazoles are actively used as an electric/electronic material in devices such as a display, a memory, a solar cell, and the like and also have attracted attention as a material for use in automotive and aerospace fields.

In particular, a positive photosensitive resin composition including the polybenzoxazole has recently been increasingy used in a display area as an organic insulation layer or a barrier rib material and extensively used for a laptop computer, a monitor, and a TV image due to lightness, thinness, low price, and low power consumption of a display, excellent adherence to an integrated circuit, and the like. However, the polybenzoxazole precursor (PBO) is not partially ring-closed but thermally decomposed during thermal curing and thus, deteriorates strength of a final film, chemical and heat resistance, and the like. In addition, the non-ring closed polybenzoxazole precursor may cause out gas. Thus there has been an ongoing effort to improve heat and chemical resistance, strength, dimensional stability, and the like by introducing a thermosetting cross-linking agent having an appropriate structure.

SUMMARY

One embodiment of the present invention provides a positive photosensitive resin composition that can have improved heat resistance, chemical resistance and mechanical characteristics.

Another embodiment of the present invention provides a photosensitive resin film using the positive photosensitive resin composition.

Yet another embodiment of the present invention provides a display device including the photosensitive resin film.

One embodiment of the present invention provides a positive photosensitive resin composition including (A) an alkali soluble resin; (B) a photosensitive diazoquinone compound; (C) a thermosetting cross-linking agent represented by the following Chemical Formula 1; and (D) a solvent.

[Chemical Formula 1]

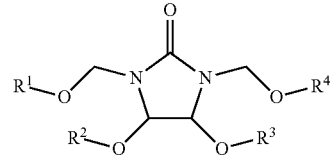

In the above Chemical Formula 1, $R^1$ to $R^4$ are the same or different and each are independently hydrogen, substituted or unsubstituted C1 to C20 alkyl, substituted or unsubstituted C3 to C20 cycloalkyl, or substituted or unsubstituted C6 to C20 aryl, wherein at least one of $R^2$ and $R^3$ is hydrogen.

The thermosetting cross-linking agent may be represented by the following Chemical Formula 2 and/or Chemical Formula 3.

[Chemical Formula 2]

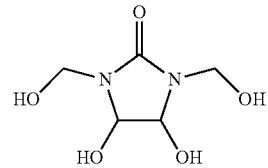

[Chemical Formula 3]

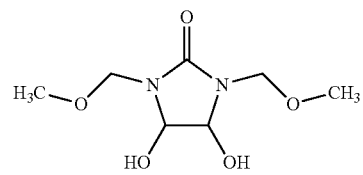

The alkali soluble resin may be a polybenzoxazole precursor, a polyimide precursor, or a combination thereof.

The polybenzoxazole precursor may include a structural unit represented by the following Chemical Formula 9, and the polyimide precursor may include a structural unit represented by the following Chemical Formula 10.

[Chemical Formula 9]

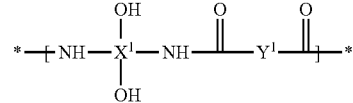

In the above Chemical Formula 9, each $X^1$ is the same or different and each is independently a substituted or unsubstituted C6 to C30 aromatic organic group, and each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

[Chemical Formula 10]

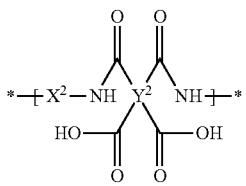

In the above Chemical Formula 10, each $X^2$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and each $Y^2$ is the same or different and each is independently a substituted or unsubstituted C6 to C30 aromatic organic group, a substituted or unsubstituted quadrivalent to hexavalent C1 to C30 aliphatic organic group, or a substituted or unsubstituted quadrivalent to hexavalent C3 to C30 alicyclic organic group.

The positive photosensitive resin composition may further include a dissolution-controlling agent represented by the following Chemical Formula 7.

[Chemical Formula 7]

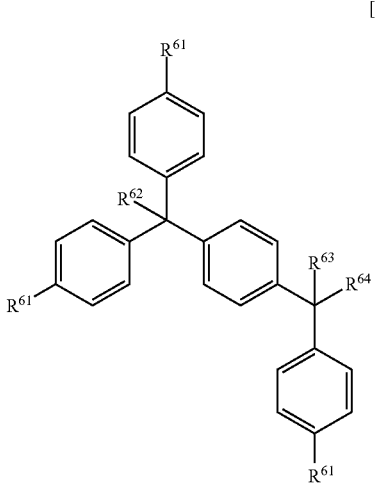

In the above Chemical Formula 7, each $R^{61}$ is the same or different and each is independently hydrogen, a hydroxy group, or substituted or unsubstituted alkyl, and $R^{62}$ to $R^{64}$ are the same or different and are each independently substituted or unsubstituted alkyl.

The positive photosensitive resin composition may include about 5 to about 100 parts by weight of the photosensitive diazoquinone compound (B); about 0.5 to about 30 parts by weight the thermosetting cross-linking agent (C); and about 100 to about 400 parts by weight of the solvent (D), each based on about 100 parts by weight of the alkali soluble resin (A).

The positive photosensitive resin composition may further include an additive selected from a surfactant, a leveling agent, a silane coupling agent, a thermal acid generator, and a combination thereof.

Another embodiment of the present invention provides a photosensitive resin film manufactured using the positive photosensitive resin composition.

Yet another embodiment of the present invention provides a display device including the photosensitive resin film.

The positive photosensitive resin composition according to one embodiment of the present invention can have improved heat resistance, chemical resistance and mechanical characteristics, and can decrease out gas generation amounts, and thus a photosensitive resin film and a display device having improved reliability may be provided.

DETAILED DESCRIPTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with at least one or more substituents including halogen (F, Br, Cl or I), a hydroxy group, a nitro group, a cyano group, an amino group ($NH_2$, $NH(R^{200})$ or $N(R^{201})(R^{202})$, wherein $R^{200}$, $R^{201}$ and $R^{202}$ are the same or different and are each independently C1 to C10 alkyl), an amidino group, a hydrazine group, a hydrazone group, a carboxyl group, substituted or unsubstituted alkyl, substituted or unsubstituted alkenyl, substituted or unsubstituted alkynyl, a substituted or unsubstituted alicyclic organic group, substituted or unsubstituted aryl, a substituted or unsubstituted heterocyclic group, or a combination thereof, instead of a functional group of the present invention.

As used herein, when a specific definition is not otherwise provided, the term "alkyl" refers to C1 to C20 alkyl, for example C1 to C15 alkyl, the term "cycloalkyl" refers to C3 to C20 cycloalkyl, for example C3 to C18 cycloalkyl, the term "alkoxy" refers to C1 to C20 alkoxy, for example C1 to C18 alkoxy, the term "aryl" refers to C6 to C20 aryl, for example C6 to C18 aryl, the term "alkenyl" refers to C2 to C20 alkenyl, for example C2 to C18 alkenyl, the term "alkylene" refers to C1 to C20 alkylene, for example C1 to C18 alkylene, and the term "arylene" refers to C6 to C20 arylene, for example C6 to C16 arylene.

As used herein, when a specific definition is not otherwise provided, the term "aliphatic organic group" refers to C1 to C20 alkyl, C2 to C20 alkenyl, C2 to C20 alkynyl, C1 to C20 alkylene, 02 to C20 alkenylene, or C2 to C20 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" refers to C3 to C20 cycloalkyl, C3 to C20 cycloalkenyl, C3 to C20 cycloalkynyl, C3 to C20 cycloalkylene, C3 to C20 cycloalkenylene, or C3 to C20 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" refers to C6 to C20 aryl or C6 to C20 arylene, for example C6 to C16 aryl or C6 to C16 arylene, and the term "heterocyclic group" refers to C2 to C20 cycloalkyl, C2 to C20 cycloalkylene, C2 to C20 cydoalkenyl, C2 to C20 cycloalkenylene, C2 to C20 cycloalkynyl, C2 to C20 cycloalkynylene, C2 to C20 heteroaryl, or C2 to C20 heteroarylene that include 1 to 3 hetero atoms including O, S, N, P, Si, or a combination thereof in a ring, for example C2 to C15 cycloalkyl, C2 to C15 cycloalkylene, C2 to C15 cydoalkenyl, C2 to C15 cycloalkenylene, C2 to C15 cycloalkynyl, C2 to C15 cycloalkynylene, C2 to C15 heteroaryl, or C2 to C15 heteroarylene that include 1 to 3 hetero atoms including O, S, N, P, Si, or a combination thereof in a ring.

As used herein, when a definition is not otherwise provided, the term "combination" refers to mixing and/or copolymerization. In addition, the term "copolymerization" refers to block copolymerization and/or random copolymerization, and the term "copolymer" refers to a block copolymer and/or a random copolymer.

As used herein, "*" refers to a linking part between the same or different atoms, or Chemical Formulae.

Hereinafter, each component of the positive photosensitive resin composition according to exemplary embodiments is described.

(C) Thermosetting Cross-Linking Agent

The positive photosensitive resin composition according to one embodiment includes a thermosetting cross-linking agent represented by the above Chemical Formula 1 and thus can improve heat resistance and chemical resistance of a photosensitive resin film.

Each $R^2$ and $R^3$ may be hydrogen. Herein, the content of a hydroxy group is increased and helps a cross-linking reaction and increases cross-linking density, and the increased cross-linking density may decrease the amount of out gas. Accordingly, a urea-based compound including the hydroxy group and an N-methylol or a methoxymethyl group helps cross-linking in a non-exposed region, and a positive photosensitive resin composition including the urea-based compound may have excellent heat and chemical resistance.

According to one embodiment of the present invention, the photosensitive resin composition includes a urea-based compound including a hydroxy group and an N-methylol or a methoxymethyl group and in particular, a compound represented by the above Chemical Formula 1 as a thermosetting cross-linking agent and may have excellent reliability. In other words, the compound represented by the above Chemical Formula 1 does not have a linear structure but instead has a cyclic structure and thus, has heat and chemical resistance, and at least one carbon atom in the cyclic structure necessarily includes a hydroxy group and smoothes a cross-linking reaction between an alkali soluble resin and a cross-linking agent through a hydrogen bond. In addition, the smooth cross-linking reaction may increase cross-linking density and decrease the amount of out gas.

For example, the thermosetting cross-linking agent may be represented by the following Chemical Formula 2 and/or Chemical Formula 3.

[Chemical Formula 2]

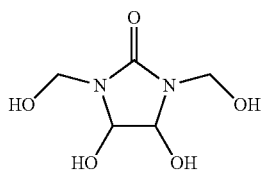

[Chemical Formula 3]

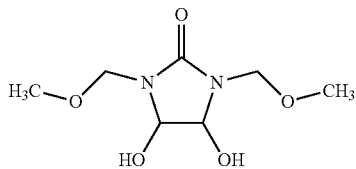

As shown in the above Chemical Formulae 2 to 3, when a hydroxy group is connected to a carbon atom in a ring, a cross-linking reaction of a cross-linking agent with an alkali soluble resin through a hydrogen bond and thus, cross-linking density due to the cross-linking reaction may be increased, and the cyclic moiety may increase heat and chemical resistance and a development speed and thus, improve sensitivity. In addition, when the hydroxy group coexists with an alkoxy hydrocarbon group at the terminal end as shown in Chemical Formula 3, a packing effect through the hydrogen bond as well as the cross-linking reaction may be expected, and thus, developability may be enhanced.

The positive photosensitive resin composition may include the thermosetting cross-linking agent in an amount of about 0.5 to about 30 parts by weight, for example about 1 to about 10 parts by weight, based on about 100 parts by weight of the alkali soluble resin. In some embodiments, the positive photosensitive resin composition may include the thermosetting cross-linking agent in an amount of about 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the thermosetting cross-linking agent can be in a range from about any of the foregoing amounts to about any other of the foregoing amounts.

When the thermosetting cross-linking agent is used in an amount within the above range, excellent heat resistance and chemical resistance may be obtained.

(A) Alkali Soluble Resin

The alkali soluble resin may be a polybenzoxazole precursor, a polyimide precursor, or a combination thereof. For example, the alkali soluble resin may be a polybenzoxazole precursor.

The polybenzoxazole precursor may include a structural unit represented by the following Chemical Formula 9, and the polyimide precursor may include a structural unit represented by the following Chemical Formula 10.

[Chemical Formula 9]

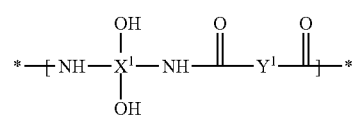

In the above Chemical Formula 9, each $X^1$ is the same or different and each is independently a substituted or unsubstituted C6 to C30 aromatic organic group, and each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

[Chemical Formula 10]

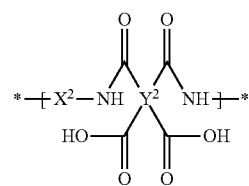

In the above Chemical Formula 10, each $X^2$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and each $Y^2$ is the same or different and each is independently a substituted or unsubstituted C6 to C30 aromatic organic group, a substituted or unsubstituted quadrivalent to hexavalent C1 to C30 aliphatic organic group, or a substituted or unsubstituted quadrivalent to hexavalent C3 to C30 alicyclic organic group.

In the above Chemical Formula 9, X' may be an aromatic organic group and may be a residual group derived from aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(3-amino-3-hydroxyphenyl)propane, bis(3-amino-4-hydroxyphenyl)sulfone, bis(4-amino-3-hydroxyphenyl)sulfone, 2,2-bis (3-amino-4-hydroxyphenyl)-1,1,1,3,3,3-hexafluoropropane, 2,2-bis(4-amino-3-hyd roxyphenyl)-1,1,1,3,3,3-hexafluoropropane, 2,2-bis(3-amino-4-hydroxy-5-trifluoromethylphenyl) hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis (4-amino-3-hydroxy-5-trifluoromethylphenyl) hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl) hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane 2-(3-amino-4-hydroxy-6-trifluoromethylphenyl)-2-(3-hydroxy-4-amino-5-trifluoromethylphenyl)hexafluoropropane, and the like, and combinations thereof.

Examples of $X^1$ may be a functional group represented by the following Chemical Formulae 20 and/or 21, but are not limited thereto.

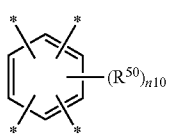

[Chemical Formula 20]

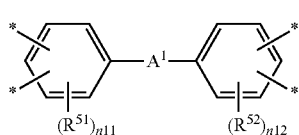

[Chemical Formula 21]

In the above Chemical Formulae 20 and 21, $A^1$ is a single bond, O, CO, $CR^{47}R^{48}$, $SO_2$ or S, wherein $R^{47}$ and $R^{48}$ are the same or different and are each independently hydrogen or substituted or unsubstituted C1 to C30 alkyl, for example C1 to C30 fluoroalkyl, $R^{50}$ to $R^{52}$ are the same or different and are each independently hydrogen, substituted or unsubstituted C1 to C30 alkyl, a substituted or unsubstituted C1 to C30 carboxyl group, a hydroxy group, or a thiol group, n10 is an integer of 0 to 2, and n11 and n12 are the same or different and are each independently integer of 0 to 3.

In the above Chemical Formula 9, $Y^1$ may be an aromatic organic group, a divalent to hexavalent aliphatic organic group, or a divalent to hexavalent alicyclic organic group, and may be a residual group of dicarboxylic acid or a residual group of a dicarboxylic acid derivative. For example, $Y^1$ may be an aromatic organic group or a divalent to hexavalent alicyclic organic group.

Examples of the dicarboxylic acid derivative may include without limitation 4,4'-oxydibenzoylchloride, diphenyloxydicarbonyldichloride, bis(phenylcarbonylchloride)sulfone, bis(phenylcarbonylchloride)ether, bis(phenylcarbonylchloride)phenone, phthaloyldichloride, terephthaloyldichloride, isophthaloyldichloride, dicarbonyldichloride, diphenyloxydicarboxylatedibenzotriazole and the like, and combinations thereof.

Examples of $Y^1$ may be a functional group represented by the following Chemical Formulae 22 to 24, but are not limited thereto.

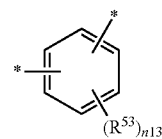

[Chemical Formula 22]

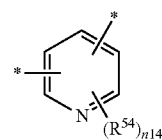

[Chemical Formula 23]

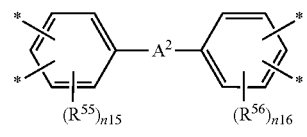

[Chemical Formula 24]

In the above Chemical Formulae 22 to 24, $R^{53}$ to $R^{56}$ are the same or different and are each independently hydrogen or substituted or unsubstituted C1 to C30 alkyl, n13 and n14 are the same or different and are each independently integers ranging from 0 to 4, n15 and n16 are the same or different and are each independently integers of 0 to 3, and $A^2$ is a single bond, O, $CR^{47}R^{48}$, CO, CONH, S or $SO_2$, wherein $R^{47}$ and $R^{48}$ are the same or different and are each independently hydrogen or substituted or unsubstituted C1 to C30 alkyl, for example C1 to C30 fluoroalkyl.

In the above Chemical Formula 10, $X^2$ may be an aromatic organic group, a divalent to hexavalent aliphatic organic group, or a divalent to hexavalent alicyclic organic group. For example, $X^2$ may be an aromatic organic group or a divalent to hexavalent alicyclic organic group.

In exemplary embodiments, $X^2$ may be a residual group derived from aromatic diamine, alicyclic diamine or silicon diamine. Herein, the aromatic diamine, alicyclic diamine and silicon diamine may be used singularly or in a mixture of two or more.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenyl sulfide, benzidine, m-phenylenediamine, p-phenylenediamine, 1,5-naphthalenediamine, 2,6-naphthalenediamine, bis[4-(4-aminophenoxy)phenyl]sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, compounds substituted with alkyl group or a halogen in the aromatic ring, and the like, and combinations thereof.

Examples of the alicyclic diamine may include without limitation 1,2-cyclohexyl diamine, 1,3-cyclohexyl diamine, and the like, and combinations thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

In the above Chemical Formula 10, $Y^2$ may be an aromatic organic group, a quadrivalent to hexavalent aliphatic organic group, or a quadrivalent to hexavalent alicyclic organic group. For example, $Y^2$ may be an aromatic organic group or a quadrivalent to hexavalent alicyclic organic group.

$Y^2$ may be a residual group derived from aromatic acid dianhydride or alicyclic acid dianhydride. Herein, the aromatic acid dianhydride and the alicyclic acid dianhydride may be used singularly or in a mixture of one or more.

Examples of the aromatic acid dianhydride may include without limitation benzophenone tetracarboxylic dianhydride such as pyromellitic dianhydride; benzophenone-3,3', 4,4'-tetracarboxylic dianhydride; oxydiphthalic acid dianhydride such as 4,4'-oxydiphthalic dianhydride; biphthalic dianhydride such as 3,3',4,4'-biphthalic dianhydride; hexafluoroisopropyledene)diphthalic dianhydride such as 4,4'-(hexafluoroisopropyledene)diphthalic dianhydride; naphthalene-1,4,5,8-tetracarboxylic dianhydride; 3,4,9,10-perylenetetracarboxylic dianhydride, and the like, and combinations thereof.

Examples of the alicyclic acid dianhydride may include without limitation 1,2,3,4-cyclobutanetetracarboxylic dianhydride, 1,2,3,4-cyclopentanetetracarboxylic dianhydride, 5-(2,5-dioxotetrahydrofuryl)-3-methyl-cyclohexane-1,2-dicarboxylic anhydride, 4-(2,5-dioxotetrahydrofuran-3-yl)-tetralin-1,2-dicarboxylic anhydride, bicyclooctene-2,3,5,6-tetracarboxylic dianhydride, bicyclooctene-1,2,4,5-tetracarboxylic dianhydride, and the like, and combinations thereof.

The alkali soluble resin may include a thermally polymerizable functional group derived from reactive end-capping monomer at at least one terminal end of branched chain of the alkali soluble resin. Examples of the reactive end-capping monomer may include without limitation monoamines including double bonds, monoanhydrides including double bonds, and the like, and combinations thereof.

Examples of the monoamines may include without limitation toluidine, dimethylaniline, ethylaniline, aminophenol, aminobenzylalcohol, aminoindan, aminoacetonephenone, and the like, and combinations thereof.

The alkali soluble resin may have a weight average molecular weight (Mw) of about 3,000 to about 300,000 g/mol. When the weight average molecular weight is within the above range, sufficient properties may be obtained, and it may be easy to handle due to improved dissolution for an organic solvent.

(B) Photosensitive Diazoquinone Compound

The photosensitive diazoquinone compound may be a compound including a 1,2-benzoquinone diazide and/or 1,2-naphthoquinone diazide structure.

Examples of the photosensitive diazoquinone compound may include one or more the compounds represented by the following Chemical Formulae 17 and 19, Chemical Formula 30, or Chemical Formula 31 but are not limited thereto.

[Chemical Formula 17]

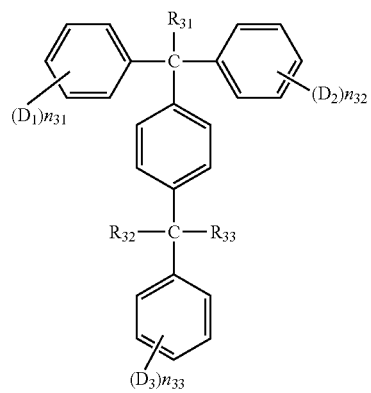

In the above Chemical Formula 17, $R_{31}$ to $R_{33}$ are the same or different and are each independently, hydrogen or substituted or unsubstituted alkyl, for example $CH_3$, $D_1$ to $D_3$ are the same or different and are each independently OQ, wherein Q is hydrogen, or the following Chemical Formula 18a or 18b, provided that all Qs are not simultaneously hydrogen, and n31 to n33 are the same or different and are each independently integers ranging from 1 to 3.

[Chemical Formula 18a]

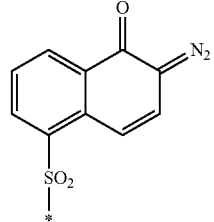

[Chemical Formula 18b]

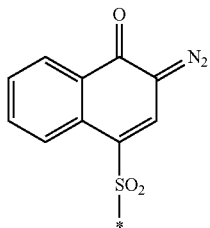

[Chemical Formula 19]

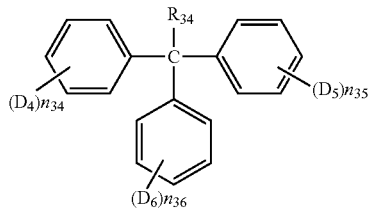

In the above Chemical Formula 19, $R_{34}$ is hydrogen or substituted or unsubstituted alkyl, $D_4$ to $D_6$ are the same or different and are each independently OQ wherein Q is the same as defined in the above Chemical Formula 17, and n34 to n36 are the same or different and are each independently integers ranging from 1 to 3.

[Chemical Formula 30]

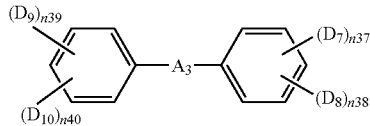

In the above Chemical Formula 30, $A_3$ is CO or CRR', wherein R and R' are the same or different and are each independently substituted or unsubstituted alkyl, $D_7$ to $D_{10}$ are the same or different and are each independently, hydrogen, substituted or unsubstituted alkyl, OQ, or NHQ, wherein Q is the same as defined in the above Chemical Formula 17, n37, n38, n39 and n40 are the same or different and are each independently integers ranging from 1 to 4, n37+n38 and n39+n40 are the same or different and are each independently integers of 5 or less, provided that at least one of $D_7$ to $D_{10}$ is OQ, and one aromatic ring includes one to three OQs and the other aromatic ring includes one to four OQs.

[Chemical Formula 31]

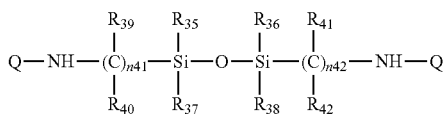

In the above Chemical Formula 31, $R_{35}$ to $R_{42}$ are the same or different and are each independently hydrogen or substituted or unsubstituted alkyl, n41 and n42 are the same or different and are each independently integers ranging from 1 to 5, for example 2 to 4, and Q is the same as defined in the above Chemical Formula 17.

The positive photosensitive resin composition may include the photosensitive diazoquinone compound in an amount of about 5 to about 100 parts by weight based on about 100 parts by weight of the alkali soluble resin. In some embodiments, the positive photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, or 100 parts by weight. Further, according to some embodiments of the present invention, the amount of the photosensitive diazoquinone compound can be in a range from about any of the foregoing amounts to about any other of the foregoing amounts.

When the amount of the photosensitive diazoquinone compound is within the above range, the pattern can be well-formed with minimal or no residue from exposure, and a film thickness loss during development can be prevented and thereby a good pattern can be provided.

(D) Solvent

The positive photosensitive resin composition includes a solvent being capable of easily dissolving each component.

The solvent may improve film uniformity during coating and prevent generation of a coating stain and a pin spot and thus, form a uniform pattern.

Examples of the solvent may include without limitation alcohols such as methanol, ethanol, benzylalcohol, hexylalcohol, and the like; ethylene glycolalkyletheracetates such as ethylene glycolmethyletheracetate, ethylene glycol ethyletheracetate, and the like; ethylene glycol alkyl ether propionates such as ethylene glycolmethylether propionate, ethylene glycolethylether propionate, and the like; ethylene glycolmonoalkylethers such as ethylene glycolmethylether, ethylene glycolethylether, and the like; diethylene glycolalkylethers such as diethylene glycolmonomethylether, diethylene glycol monoethylether, diethylene glycol dimethylether, diethylene glycolmethylethylether, and the like; propylene glycolalkyletheracetates such as propylene glycol methylether acetate, propylene glycolethyletheracetate, propylene glycolpropyletheracetate, and the like; propylene glycolalkylether propionates such as propylene glycolmethylether propionate, propylene glycolethylether propionate, propylene glycolpropylether propionate, and the like; propylene glycolmonoalkylethers such as propylene glycolmethylether, propylene glycolethylether, propylene glycolpropylether, propylene glycolbutylether, and the like; dipropylene glycolalkylethers such as dipropylene glycoldimethylether, dipropylene glycoldiethylether, and the like; butylene glycolmonomethylethers such as butylene glycolmonomethylether, butylene glycolmonoethylether, and the like; or dibutylene glycolalkylethers such as dibutylene glycoldimethylether, dibutylene glycoldiethylether, and the like. Such a solvent may be used singularly or in a mixture of two or more.

The solvent may be selected according to the process of forming a photosensitive resin film such as spin coating, slit die coating, and the like.

The positive photosensitive resin composition may include the solvent in an amount of about 100 to about 400 parts by weight based on about 100 parts by weight of the alkali soluble resin. When the solvent is included in an amount within the above range, a coating layer may have a sufficient thickness and excellent solubility and coating properties can be improved.

(E) Dissolution-Controlling Agent

The positive photosensitive resin composition according to one embodiment may further include a dissolution-controlling agent.

The dissolution-controlling agent is generally a phenol compound.

The phenol compound increases a dissolution rate and sensitivity in an exposure region during development with an alkali aqueous solution and facilitates patterning with a high resolution.

Examples of the phenol compound may include without limitation 2,6-dimethoxymethyl-4-t-butylphenol, 2,6-dimethoxymethyl-p-cresol, 2,6-diacetoxymethyl-p-cresol, and the like, and combinations thereof.

For example, the dissolution-controlling agent may be represented by the following Chemical Formula 7.

[Chemical Formula 7]

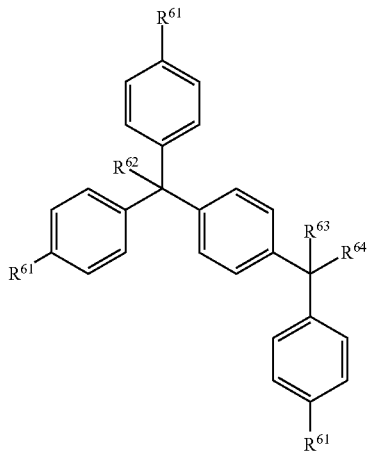

In the above Chemical Formula 7, each $R^{61}$ is the same or different and each is independently hydrogen, a hydroxy group, or substituted or unsubstituted alkyl, and $R^{62}$ to $R^{64}$ are the same or different and are each independently substituted or unsubstituted alkyl.

When the compound represented by the above Chemical Formula 7 is included as a dissolution-controlling agent, a dissolution rate and sensitivity in an exposure region during development may be improved, and in addition development residues may not be generated and thus developability may be improved.

The positive photosensitive resin composition may include the dissolution-controlling agent in an amount of about 1 to about 30 parts by weight based on about 100 parts by weight of the alkali soluble resin. In some embodiments, the positive photosensitive resin composition may include the dissolution-controlling agent in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the dissolution-controlling agent can be in a range from about any of the foregoing amounts to about any other of the foregoing amounts.

When the dissolution-controlling agent is used in an amount within the above range, a satisfactory pattern may be obtained by not deteriorating sensitivity during development but appropriately increasing a dissolution rate, and excellent storage stability may be obtained due to no precipitation when stored in a freezer.

(F) Other Additives

The positive photosensitive resin composition according to one embodiment may further include one or more other additives.

The other additive(s) may include a thermal acid generator, a surfactant, a leveling agent, a silane coupling agent, and the like, and combinations thereof.

Examples of the thermal acid generator may include without limitation arylsulfonic acids such as p-toluenesulfonic acid, benzenesulfonic acid, and the like; perfluoroalkylsulfonic acids such as trifluoromethanesulfonic acid and trifluorobutanesulfonic acid; alkylsulfonic acids such as methanesulfonic acid, ethanesulfonic acid, and butanesulfonic acid; and the like, and combinations thereof.

The thermal acid generator is a catalyst for a dehydration reaction and a cyclization reaction of polyamide including a phenolic hydroxy group of the alkali soluble resin, and thus a cyclization reaction may be performed smoothly even if a curing temperature is decreased to about 300° C.

In addition, an additive such as a suitable surfactant and/or leveling agent may be included in order to prevent a stain of the film and/or to improve the development. In addition, a silane coupling agent may be used as an adherence promoting agent in order to improve adherence with a substrate.

The thermal acid generator, the surfactant, the leveling agent, the silane coupling agent may be used singularly or in a mixture thereof.

The process for forming a pattern using the positive photosensitive resin composition according to one embodiment includes coating the positive photosensitive resin composition on a supporting substrate using spin coating, slit coating, inkjet printing, and the like; drying the coated positive photosensitive resin composition to form a positive photosensitive resin composition layer; exposing the positive photosensitive resin composition layer; developing the positive photosensitive resin composition layer in an alkali aqueous solution to provide a photosensitive resin film; and heating the photosensitive resin film. The conditions of processes to provide a pattern are widely known in this art, so detailed descriptions thereof will be omitted in this specification.

According to another embodiment of the present invention, a photosensitive resin film manufactured using the positive photosensitive resin composition is provided.

The photosensitive resin film may be used as an organic insulation layer, a buffer layer, and/or a protective layer.

According to further embodiment, a display device including the photosensitive resin film is provided.

The display device may be an organic light emitting diode (OLED) and/or a liquid crystal display (LCD).

That is to say, the positive photosensitive resin composition according to one embodiment may be applied to an organic insulation layer, a passivation layer, and/or an insulation interlayer in a display device.

Hereinafter, the present invention is illustrated in more detail with reference to the following examples and comparative examples. However, the following examples are exemplary only and the present invention is not limited thereto.

EXAMPLES

Synthesis of Polybenzoxazole Precursor 41.1 g of 2,6-bis[[[5-[1-(amino-4-hydroxyphenyl)-2,2,2-trifluoro-1-(trifluoromethyl)ethyl]-2-hydroxyphenyl]amino]methyl]-4-methylphenol is dissolved in 280 g of N-methyl-2-pyrrolidone (NMP) in a four-necked flask equipped with an agitator, a temperature controller, a nitrogen gas injector and a cooler while nitrogen is passed through the flask. When the solid is completely dissolved, 9.9 g of pyridine is added to the solution, and a solution obtained by dissolving 13.3 g of 4,4'-oxydibenzonyl chloride in 142 g of N-methyl-2-pyrrolidone (NMP) is slowly added thereto in a dropwise fashion for 30 minutes while the flask is maintained at 0° C. to 5° C. After the addition in a dropwise fashion, the mixture is reacted at 0° C. to 5° C. for one hour and then, agitated for one hour after increasing its temperature up to room temperature, completing the reaction.

Subsequently, 1.6 g of 5-norbornene-2,3-dicarboxyl anhydride is added thereto, and the mixture is agitated at 70° C. for 24 hours, completing the reaction. The reaction mixture is put in a solution of water/methanol (a volume ratio=10/1) to produce a precipitate, the precipitate is filtered, sufficiently washed with water, and dried at 80° C. under vacuum for greater than or equal to 24 hours, obtaining a polybenzoxazole precursor having a weight average molecular weight of 9,500 g/mol and represented by the following Chemical Formula A.

Preparation of Positive Photosensitive Resin Composition

Example 1

A positive photosensitive resin composition is obtained by adding 100 g of a polybenzoxazole (PBO) precursor represented by Chemical Formula A to 270 g of a three component solvent of propylene glycol monomethyl ether (PGME)/Ethyl lactate (EL)/gamma butyrolactone (GBL) and dissolving it therein, adding 40 g of photosensitive diazoquinone represented by Chemical Formula B, 20 g of (α,α,α-tris(4-hydroxyphenyl)-1-ethyl-4-isopropyl benzene, hereinafter, referred to be TPPA) represented by Chemical Formula C as a dissolution-controlling agent, 3 g of dimethyloldihydroxyethyleneurea (DMDHEU) represented by Chemical Formula 2 as a thermosetting cross-linking agent thereto, agitating and stabilizing the mixture for 3 hours after increasing the temperature up to room temperature, and filtering the resultant with a 0.45 μm fluoro resin filter.

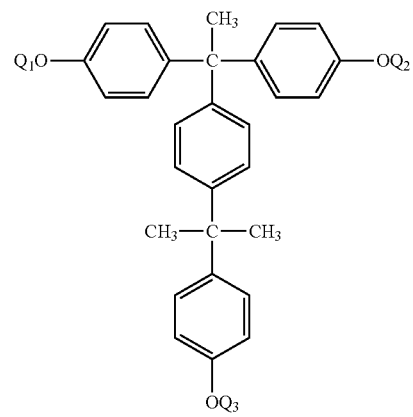

[Chemical Formula B]

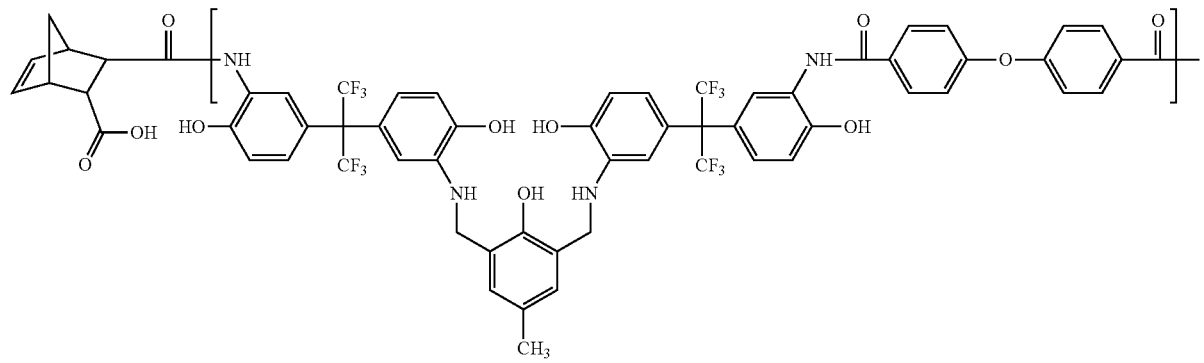

[Chemical Formula A]

In the above chemical formulae, two of $Q_1$ to $Q_3$ are represented by,

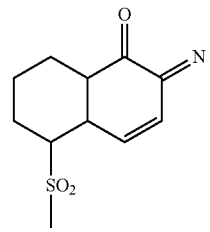 [SMILES: CS(=O)(=O)C1CCCC2C(=O)C(=N)C=CC21]

and remaining one is hydrogen.

[Chemical Formula C]

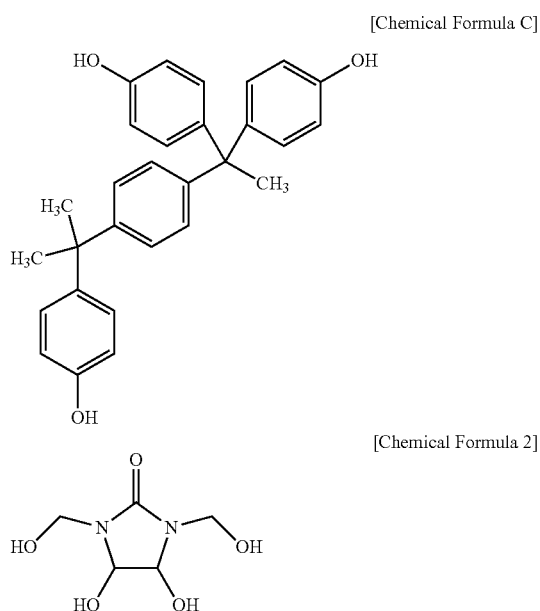

[Chemical Formula 2]

Example 2

A photosensitive resin composition is prepared according to the same method as Example 1 except for using 3 g of the DMDHEU represented by Chemical Formula 2 instead of 1 g.

Example 3

A photosensitive resin composition is prepared according to the same method as Example 1 except for using 5 g of the DMDHEU represented by Chemical Formula 2 instead of 1 g.

Example 4

A photosensitive resin composition is prepared according to the same method as Example 1 except for using 10 g of the DMDHEU represented by Chemical Formula 2 instead of 1 g.

Example 5

A photosensitive resin composition is prepared according to the same method as Example 1 except for using dimethoxymethyldihydroxyethyleneurea (methylated DMDHEU) represented by Chemical Formula 3 instead of the DMDHEU represented by Chemical Formula 2.

[Chemical Formula 3]

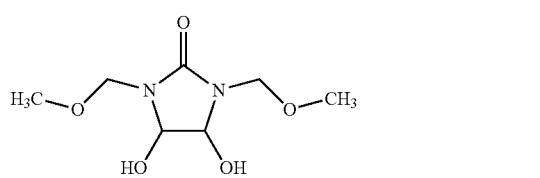

Example 6

A photosensitive resin composition is prepared according to the same method as Example 5 except for using 3 g of the methylated DMDHEU represented by Chemical Formula 3 instead of 1 g.

Example 7

A photosensitive resin composition is prepared according to the same method as Example 5 except for using 5 g of the methylated DMDHEU represented by Chemical Formula 3 instead of 1 g.

Example 8

A photosensitive resin composition is prepared according to the same method as Example 5 except for using 10 g of the methylated DMDHEU represented by Chemical Formula 3 instead of 1 g.

Comparative Example 1

A photosensitive resin composition is prepared according to the same method as Example 1 except for using no thermosetting cross-linking agent.

Comparative Example 2

A photosensitive resin composition is prepared according to the same method as Example 1 except for using a compound represented by the following Chemical Formula D instead of the DMDHEU represented by Chemical Formula 2 as a thermosetting cross-linking agent.

[Chemical Formula D]

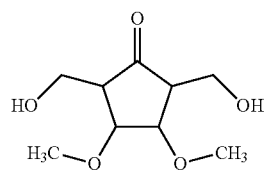

Comparative Example 3

A photosensitive resin composition is prepared according to the same method as Example 1 except for using a compound represented by the following Chemical Formula E instead of the DMDHEU represented by Chemical Formula 2 as a thermosetting cross-linking agent.

[Chemical Formula E]

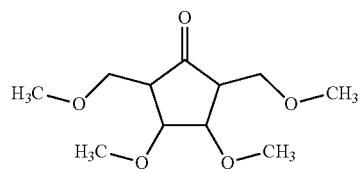

Each component used to prepare the photosensitive resin compositions according to Examples 1 to 8 and Comparative Examples 1 to 3 and its amount are provided in the following Table 1.

TABLE 1

| Raw material | | Comp. Ex. 1 | Comp. Ex. 2 | Comp. Ex. 3 | Ex. 1 | Ex. 2 | Ex. 3 | Ex. 4 | Ex. 5 | Ex. 6 | Ex. 7 | Ex. 8 |
|---|---|---|---|---|---|---|---|---|---|---|---|---|
| PBO precursor | | 100 | 100 | 100 | 100 | 100 | 100 | 100 | 100 | 100 | 100 | 100 |
| diazoquinone compound | | 40 | 40 | 40 | 40 | 40 | 40 | 40 | 40 | 40 | 40 | 40 |
| cross-linking agent | Chemical Formula 2 | — | — | — | 1 | 3 | 5 | 10 | — | — | — | — |
| | Chemical Formula 3 | — | — | — | — | — | — | — | 1 | 3 | 5 | 10 |
| | Chemical Formula D | — | 1 | — | — | — | — | — | — | — | — | — |
| | Chemical Formula E | — | — | 1 | — | — | — | — | — | — | — | — |
| Dissolution-controlling agent | | 20 | 20 | 20 | 20 | 20 | 20 | 20 | 20 | 20 | 20 | 20 |
| PGME | | 180 | 180 | 180 | 180 | 180 | 180 | 180 | 180 | 180 | 180 | 180 |
| EL | | 60 | 60 | 60 | 60 | 60 | 60 | 60 | 60 | 60 | 60 | 60 |
| GBL | | 30 | 30 | 30 | 30 | 30 | 30 | 30 | 30 | 30 | 30 | 30 |

Evaluation (1) Formation of Film and Pattern

The photosensitive resin compositions according to Examples 1 to 8 and Comparative Examples 1 to 3 are respectively spin-coated on an ITO glass and heated on a hot plate at 120° C. for 100 seconds, forming each photosensitive polybenzoxazole precursor film. The polybenzoxazole precursor films are exposed by using a mask having various sized-patterns and an I-line stepper (NSR i10C) made by Nikon Inc. and then, washed with pure water for 30 seconds after removing an exposure region in a 2.38% tetramethylammonium hydroxide aqueous solution at room temperature for 40 seconds through two puddles. Subsequently, the obtained patterns are cured at 250° C. for 40 minutes under an $N_2$ atmosphere by using an electric furnace under an oxygen concentration of 1000 ppm.

(2) Measurement of Film Residue Ratio

The pre-baked films are developed in a 2.38% tetramethylammoniumhydroxide (TMAH) aqueous solution at 23.5° C. for 60 seconds, washed with ultrapure water for 60 seconds, and dried, and then, the thickness of the films is measured by using Alpha Step (KLA-Tencor Corp.), and their film residue ratios are calculated according to the following equation 1.

Film residue ratio (%)=(Film thickness after development/Initial film thickness before development)×100 [Equation 1]

(3) Measurement of Sensitivity

Sensitivity is measured by measuring exposure time taken until a 10 μm L/S pattern is formed to have a line width of 1:1 after exposure and development and then, regarding this exposure time as optimal exposure time, and a minimum pattern dimension in the optimal exposure time is measured as resolution.

(4) Measurement of Chemical Resistance

The photosensitive resin compositions according to Examples 1 to 8 and Comparative Examples 1 to 3 are respectively spin-coated on an ITO glass, heated on a hot plate at 120° C. for 100 seconds to form each photosensitive polybenzoxazole precursor film and then, thermally cured at 250° C. for 40 seconds, manufacturing a sample for a chemical resistance test.

In the present invention, the chemical resistance test is performed by applying four kinds of solvent such as NMP, DMAc, DMF, and GBL, dipping the obtained coating film in each solvent for 30° C./10 minutes, and film thickness before and after dipping the film in each solvent is measured and used to calculate chemical resistance according to the following Equation 2.

Chemical resistance (%)=Film thickness after dipping the film in organic solvent (μm)/Film thickness before dipping (μm)×100 [Equation 2]

(5) Measurement of Heat Resistance

The film manufactured according to the same method as the (4) is peeled off from the glass substrate and analyzed through thermogravimetric analysis (TGA) equipment. T1% is defined as a temperature at which the weight of the film sample is 1% decreased relative to the initial weight of the film, and Td is defined as a temperature at which the film starts to have a main thermodegradation.

(6) Measurement of Out Gas

The film sample manufactured according to the same method as the (4) is cut into a size of 7 cm*7 cm, and out gas is captured by using a flat disk collector (FD-400, JAI) and quantitatively analyzed by using a thermal desorption system (JTD-505III, JAI). A calibration-curve is obtained by using He gas as a mobile phase and toluene as a standard solution, and the out gas amount of the film sample according to Comparative Example 1 is used as a reference to calculate an out gas ratio of the other film samples.

Sensitivity and chemical and heat resistances of the positive photosensitive resin compositions according to Examples 1 to 8 and Comparative Examples 1 to 3 are evaluated, and the results are provided in the following Table 2.

TABLE 2

| | Comp. Ex. 1 | Comp. Ex. 2 | Comp. Ex. 3 | Ex. 1 | Ex. 2 | Ex. 3 | Ex. 4 | Ex. 5 | Ex. 6 | Ex. 7 | Ex. 8 |
|---|---|---|---|---|---|---|---|---|---|---|---|
| Film residue ratio after development (%) | 80 | 70 | 85 | 74 | 72 | 77 | 75 | 80 | 84 | 85 | 90 |

TABLE 2-continued

| | | Comp. Ex. 1 | Comp. Ex. 2 | Comp. Ex. 3 | Ex. 1 | Ex. 2 | Ex. 3 | Ex. 4 | Ex. 5 | Ex. 6 | Ex. 7 | Ex. 8 |
|---|---|---|---|---|---|---|---|---|---|---|---|---|
| Sensitivity (mJ) | | 200 | 130 | 220 | 180 | 160 | 185 | 170 | 175 | 180 | 170 | 175 |
| Chemical resistance (%) | DMF | 98 | 98 | 99 | 99 | 100 | 99 | 100 | 100 | 100 | 100 | 100 |
| | DMAc | 99 | 99 | 100 | 100 | 100 | 100 | 100 | 100 | 100 | 100 | 100 |
| | NMP | 97 | 98 | 99 | 99 | 100 | 99 | 100 | 100 | 100 | 100 | 100 |
| | GBL | 99 | 99 | 100 | 100 | 100 | 100 | 100 | 100 | 100 | 100 | 100 |
| Heat resistance (° C.) | T1% | 250 | 252 | 260 | 270 | 270 | 277 | 280 | 292 | 300 | 301 | 320 |
| | Td | 430 | 430 | 435 | 440 | 450 | 450 | 460 | 460 | 470 | 480 | 490 |
| Out gas detection amount | % | 100 | 100 | 98 | 94 | 90 | 80 | 75 | 80 | 76 | 67 | 60 |

As shown in Table 2, the samples manufactured by using the photosensitive resin compositions according to Examples 1 to 8 show very improved sensitivity compared with the samples manufactured by using the photosensitive resin compositions according to Comparative Examples 1 to 3.

In addition, the photosensitive resin compositions according to Examples 1 to 8 show improved chemical resistance in various organic solvents such as DMF, DMAc, NMP, and GBL and also much improved thermal decomposition temperature (Td) compared with the photosensitive resin compositions according to Comparative Examples 1 to 3. On the other hand, T1% is closely related with the amount of out gas, and thus, this photosensitive resin composition increased in proportion to cross-linking, and the amount of out gas decreased.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, the aforementioned embodiments should be understood to be exemplary but not limiting the present invention in any way.

What is claimed is:

1. A positive photosensitive resin composition, comprising:

(A) an alkali soluble resin;

(B) a photosensitive diazoquinone compound;

(C) a thermosetting cross-linking agent represented by the following Chemical Formula 1; and (D) a solvent:

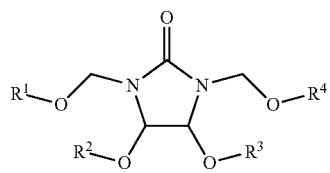

[Chemical Formula 1]

wherein, in the above Chemical Formula 1, $R^1$ to $R^4$ are the same or different and are each independently hydrogen, substituted or unsubstituted C1 to C20 alkyl, substituted or unsubstituted C3 to C20 cycloalkyl, or substituted or unsubstituted C6 to C20 aryl, wherein both of $R^2$ and $R^3$ are hydrogen.

2. The positive photosensitive resin composition of claim 1, wherein the thermosetting cross-linking agent is represented by the following Chemical Formula 2 or Chemical Formula 3 or a combination thereof:

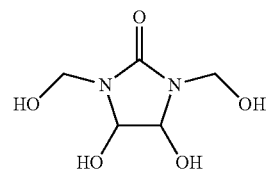

[Chemical Formula 2]

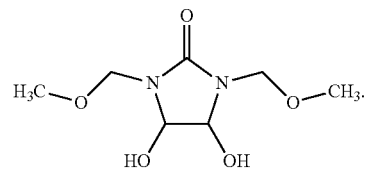

[Chemical Formula 3]

3. The positive photosensitive resin composition of claim 1, wherein the alkali soluble resin is a polybenzoxazole precursor, a polyimide precursor, or a combination thereof.

4. The positive photosensitive resin composition of claim 3, wherein the polybenzoxazole precursor comprises a structural unit represented by the following Chemical Formula 9, and the polyimide precursor comprises a structural unit represented by the following Chemical Formula 10:

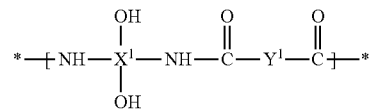

[Chemical Formula 9]

[Chemical Formula 10]

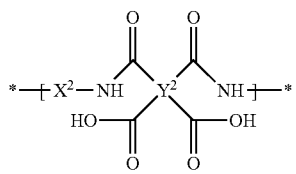

wherein, in the above Chemical Formulae 9 and 10, each $X^1$ is the same or different and each is independently a substituted or unsubstituted C6 to C30 aromatic organic group, each $X^2$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, each $Y^1$ is the same or different and each is independently a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group, and each $Y^2$ is the same or different and each is independently a substituted or unsubstituted C6 to C30 aromatic organic group, a substituted or unsubstituted quadrivalent to hexavalent C1 to C30 aliphatic organic group, or a substituted or unsubstituted quadrivalent to hexavalent C3 to C30 alicyclic organic group.

5. The positive photosensitive resin composition of claim 1, further comprising a dissolution-controlling agent represented by the following Chemical Formula 7:

[Chemical Formula 7]

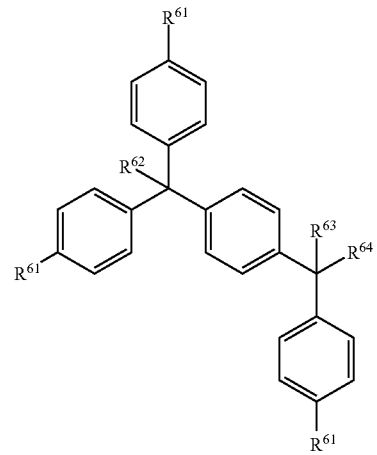

wherein, in the above Chemical Formula 7, $R^{61}$ is hydrogen, a hydroxy group, or substituted or unsubstituted alkyl, and $R^{62}$ to $R^{64}$ are the same or different and are each independently substituted or unsubstituted alkyl.

6. The positive photosensitive resin composition of claim 1, wherein the positive photosensitive resin composition comprises:

about 5 to about 100 parts by weight of the photosensitive diazoquinone compound (B);

about 0.5 to about 30 parts by weight the thermosetting cross-linking agent (C); and about 100 to about 400 parts by weight of the solvent (D), each based on about 100 parts by weight of the alkali soluble resin (A).

7. The positive photosensitive resin composition of claim 1, further comprising a surfactant, a leveling agent, a silane coupling agent, a thermal acid generator, or a combination thereof.

8. A photosensitive resin film manufactured using the positive photosensitive resin composition of claim 1.

9. A display device comprising the photosensitive resin film of claim 8.

* * * * *